(12) United States Patent
Pan et al.

(10) Patent No.: US 8,067,942 B2
(45) Date of Patent: Nov. 29, 2011

(54) METHOD FOR LOCATING PHASE TO GROUND FAULTS IN DC DISTRIBUTION SYSTEMS

(75) Inventors: Yan Pan, Tallahassee, FL (US); Paulo Silveira, Itajubá (BR); Michael Steurer, Crawfordville, FL (US); Thomas Baldwin, Tallahassee, FL (US); Paulo Ribeiro, Grand Rapids, MI (US)

(73) Assignee: Florida State University Research Foundation

( * ) Notice: Subject to any disclaimer, the term of this patent is extended or adjusted under 35 U.S.C. 154(b) by 720 days.

(21) Appl. No.: 12/286,240

(22) Filed: Sep. 29, 2008

(65) Prior Publication Data

US 2009/0085574 A1    Apr. 2, 2009

Related U.S. Application Data

(60) Provisional application No. 60/995,952, filed on Sep. 28, 2007.

(51) Int. Cl.
*G01R 31/14*   (2006.01)
*G01R 31/08*   (2006.01)
*H02H 9/08*    (2006.01)

(52) U.S. Cl. .......................... 324/509; 324/512; 361/42
(58) Field of Classification Search .................. 324/509, 324/512; 361/42
See application file for complete search history.

(56) References Cited

U.S. PATENT DOCUMENTS

| | | | | |
|---|---|---|---|---|
| 4,929,901 A | * | 5/1990 | Kimball et al. | 324/529 |
| 6,154,036 A | * | 11/2000 | Baldwin | 324/509 |
| 2004/0042137 A1 | * | 3/2004 | Wong et al. | 361/42 |

* cited by examiner

*Primary Examiner* — Amy He
(74) *Attorney, Agent, or Firm* — J. Wiley Horton

(57) ABSTRACT

A method for locating phase to ground faults in DC distribution systems. The method includes utilizing wavelet analysis using Multi-Resolution Analysis (MRA) as a signal processing tool for recognition of characteristic features in the voltage signal. The voltage signal contains characteristic information in the high frequency range above the switching frequencies of the PE converters which allows for localization of the fault.

17 Claims, 11 Drawing Sheets

METHOD FOR LOCATING PHASE TO GROUND FAULTS IN DC DISTRIBUTION SYSTEMS

CROSS-REFERENCES TO RELATED APPLICATIONS

This is a non-provisional application claiming the benefit—pursuant to 37 C.F.R. §1.53(c)—of an earlier-filed provisional application. The provisional application was filed on Sep. 28, 2007 and was assigned application Ser. No. 60/995,952.

BACKGROUND OF THE INVENTION

1. Field of the Invention

This invention relates to the field of electrical direct current distribution systems. More specifically, this invention comprises a method for locating phase to ground faults in DC distribution systems.

2. Description of the Related Art

Ungrounded or high-resistance grounded power systems have many advantages, including continuous operation after a single line to ground fault. While theoretically such an ungrounded DC system can be operated with one phase grounded through a fault, a secondary phase to ground fault on the other phase may occur causing a disruptive fault between the two phases. To reduce the probability of a second ground fault on the other phase, which results in the phase-phase fault condition with high current magnitudes and a consequential sag in supply voltage, it is of great importance to derive methods for fast and robust ground fault location in high-resistance grounded system.

The DC Zonal Electric Distribution System ("DCZEDS") discussed hereafter is part of a notional all-electric ship integrated power system (IPS) for a destroyer class ship, which includes a 80 MW power generation system, a ship hydrodynamic propulsion system, and models of various ship service loads powered through the DCZEDS.

FIG. 1 shows a simplified schematic representation of a DCZEDS (10). Bus 1 (reference numeral (12)) includes a positive and negative line (or "rail"), as does bus 2 (14). The system is divided into zones. Zone 2 (16) and zone 3 (20) are shown. Zone 2 (16) includes a pair of DC/DC converters (26) which feed power from the two buses to the loads within zone 2, which are labeled collectively as zone 2 load (18). Zone 3 likewise has a group of loads denoted as zone 3 load (22). The loads in zone 3 are also fed by a pair of DC/DC converters (26). High-resistance grounding of the buses in the DCZEDS is implemented to permit continuity of service during a ground fault (The high-resistance grounding is not shown in FIG. 1).

A method for detecting and locating a ground fault in such a system should be fast. However, the method must also be tolerant of the different possible operation modes of the DCZEDS, different system parameters causing unbalances, effects from the inherent noise due to switched converter systems, EMI noise, and other random variables (temperature, humidity, etc.). In addition, faults can be continuous or intermittent with either a constant or a random behavior of the fault resistance (which includes the arc resistance, the contact resistance, and the path resistance) as the characteristic features. The fault resistance in low or medium voltage distribution systems may vary in a wide range from a few milliohms (bolted faults) to several tens of kilo ohms (high impedance faults). It is important to remark that in high resistance grounded systems the fault current is practically independent of the fault resistance.

Previously, the ground fault locating method for an ungrounded system injects an AC signal into the faulted network and traces the signal using hand-held detectors or permanently mounted-in sensors to locate the fault. This method can be introduced into DCZEDS for locating ground faults as illustrated in FIG. 2. AC signal generator (30) is applied to center tap (32) in rectifier (24) (which feeds bus 2 (14)).

The onset of a phase-to-ground fault is detected by monitoring the line-to-ground voltages, since the fault creates a distinct voltage unbalance with respect to ground. After detecting the fault, the AC signal generator is applied for a short time and the resulting AC current is traced throughout the system in order to locate the fault. AC current measurement devices are needed in this method. However, the application of handheld AC current sensors is time consuming and subject to human error. Moreover, using a large number of fixed mounted sensors, necessary for an automated approach, requires sophisticated data communication links and also may reduce the overall reliability. Furthermore, applying this pilot signal approach of fault location to DCZEDS is expected to yield additional problems with locating common rail faults in systems with DC/DC converters which create one common bus and one "switched" bus.

Another possible method may utilize the system impedance over a wide frequency band. A signal source is momentarily applied to the DCZEDS between ground and a central point, such as a rectifier mid-point. The source can either be an adjustable, single frequency AC source or a pulse source. For the frequency domain analysis, the system impedance for a wide range of frequency is monitored by applying Fast Fourier Transforms ("FFT's") to the voltages and the resulting currents. However obtaining the accurate system impedance from measurements in a short time during system operation is a challenge. The high frequency noise caused by the interaction between Power Electronic ("PE") switching converters and cables may prohibit a good reading of the system impedance signal which is supposed to provide information regarding the fault location. An extra signal generator is needed for this approach.

Accordingly, it would be desirable to provide a new method for fault location in ungrounded or high-resistance grounded DC distribution systems which neither requires an additional signal source nor requires sensors throughout the system but can still locate the fault quickly and accurately.

BRIEF SUMMARY OF THE INVENTION

The present invention is a method for locating phase to ground faults in ungrounded or high-resistance grounded power distribution systems. Faults occurring in such a system cause disturbances in the noise patterns detected within the power supply to the system. A ground fault in a specific location creates a unique "signature" of noise pattern disturbance. The present invention presents a systematic approach to analyzing such noise pattern disturbances in order to correlate the patterns corresponding to various ground fault locations. The noise disturbances can then be monitored to rapidly detect and locate the existence of a ground fault.

The method preferably includes wavelet analysis using Multi-Resolution Analysis (MRA) as a signal processing tool for recognition of characteristic features in the voltage signal. The voltage signal contains characteristic information in the high frequency range above the switching frequencies of the power electronics (PE) converters which allows for localization of a fault.

Figure 1:
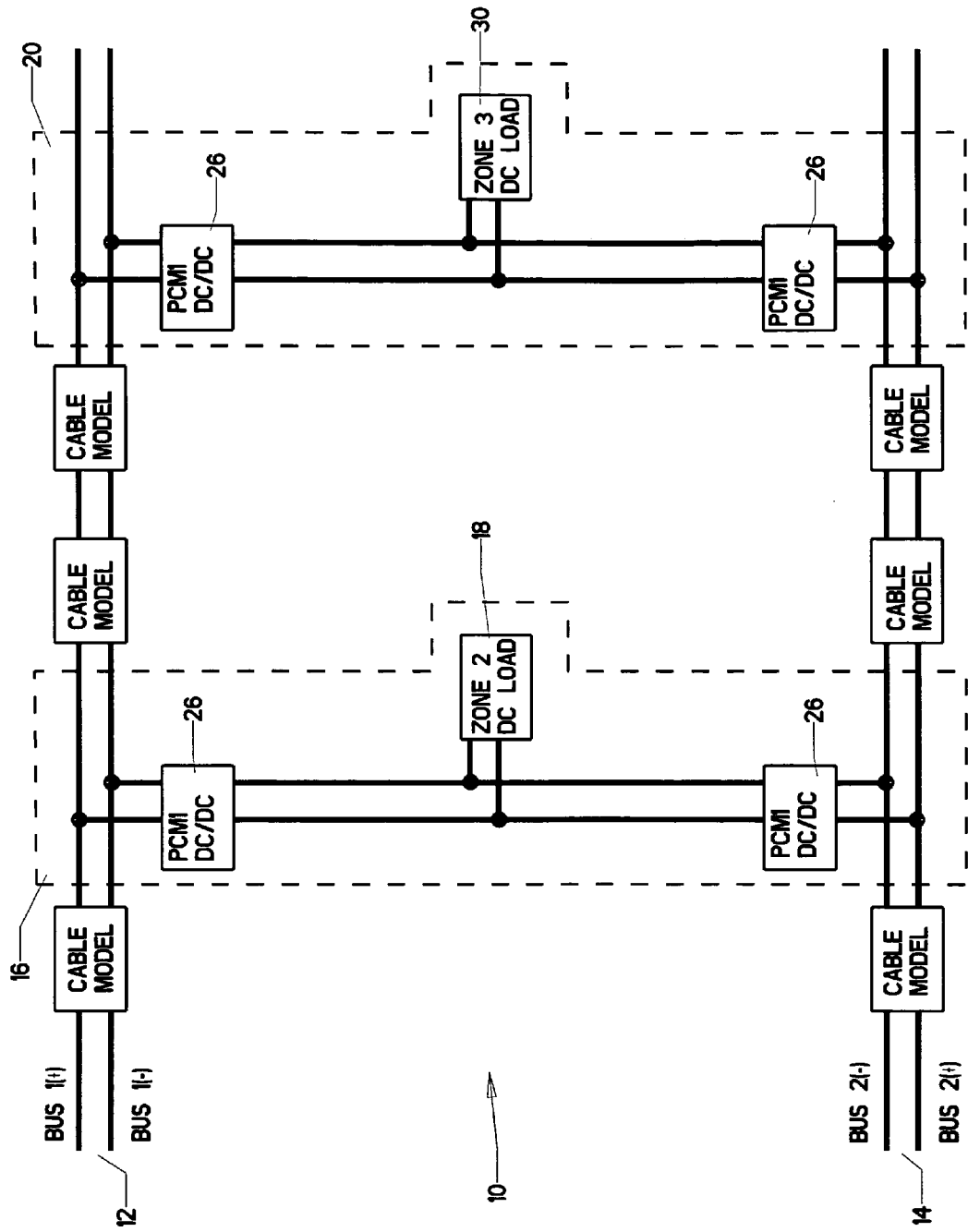
FIG. 1 is a schematic view, showing a notional DCZEDS.
Figure 2:
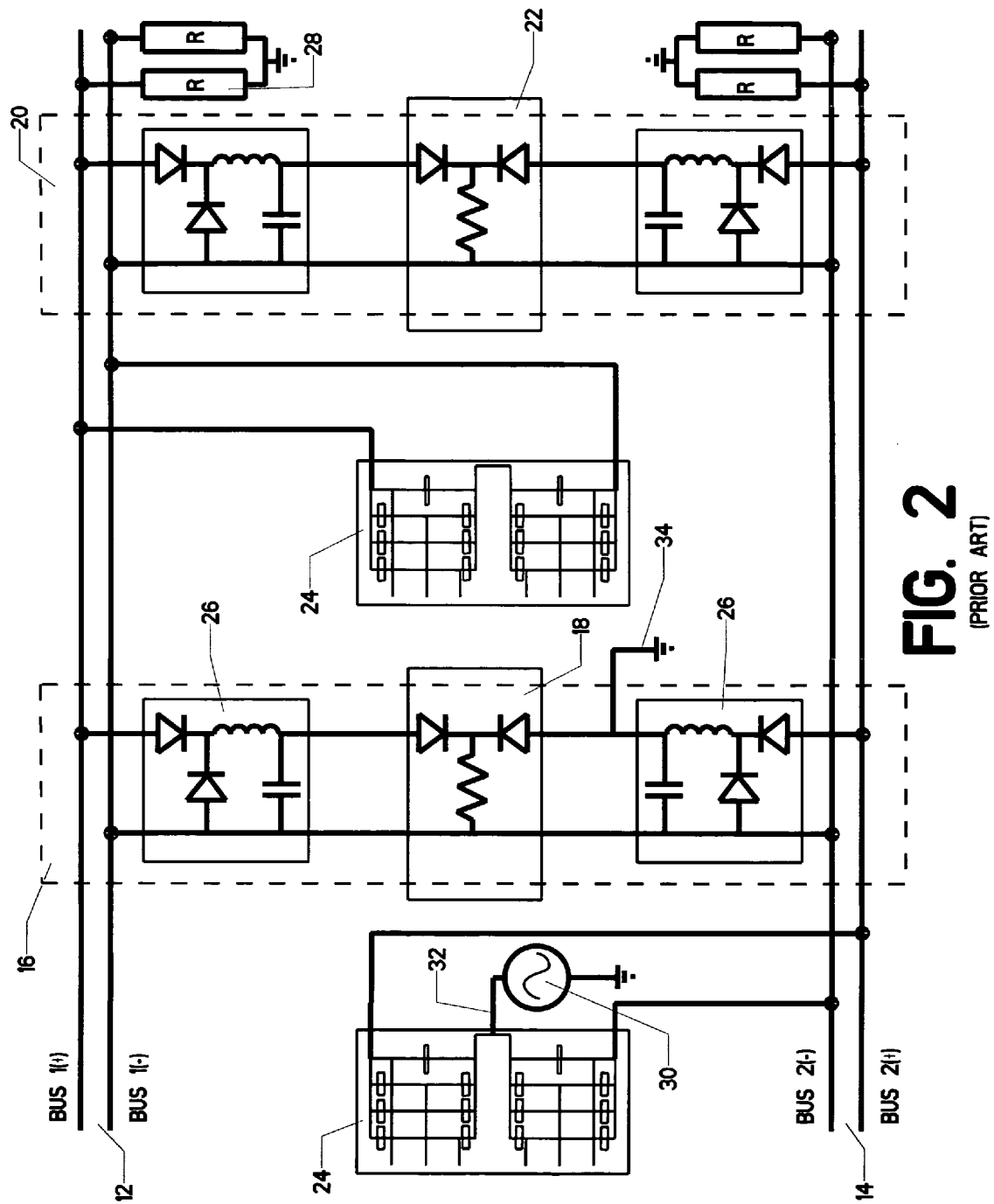
FIG. 2 is a schematic view, showing the prior art method of locating a ground to phase fault.

| REFERENCE NUMERALS IN THE DRAWINGS | | | |
|---|---|---|---|
| 10 | DCZEDS | 12 | bus 1 |
| 14 | bus 2 | 16 | zone 2 |
| 18 | zone 2 load | 20 | zone 3 |
| 22 | zone 3 load | 24 | rectifier |
| 26 | DC/DC converter | 28 | high resistance grounding |
| 30 | AC signal converter | 32 | center tap |
| 34 | ground fault | 36 | zone 2 (−) fault |
| 37 | zone 3 (−) fault | 38 | zone 2 (+) fault |
| 39 | zone 3 (+) fault | 40 | input signal |
| 42 | low pass filter | 44 | high pass filter |
| 60 | center tap signal | 62 | first frequency output |
| 64 | sixth frequency output | 66 | fourth frequency output |

DETAILED DESCRIPTION OF THE INVENTION

The present invention is a method for locating phase to ground faults in ungrounded or high-resistance grounded DC power distribution systems utilizing the switching noise contained in a suitable signal. Such a signal might be, for example, a voltage signal measured between the mid point of a voltage divider circuit (preferably a capacitive circuit) and ground to extract information about the fault locations. In any real DC distribution system which contains power electronic (PE) switching converters for voltage and power flow control, such a signal will always contain a certain amount of high frequency noise. This is caused by repetitive switching transients introduced by the PE converters interacting with parasitic elements (i.e. cable insulation capacitances) in the system. In case of a phase-to-ground fault, this voltage signal contains characteristic information in the high frequency range above the switching frequencies of the PE converters which allows for localization of the fault. It appears that significant noise patterns can be extracted by adequate signal processing methods such as wavelet analysis. These noise patterns can then be associated with a specific fault location so that when such a noise pattern appears the fault location will be known.

In one particular example wavelet analysis using Multi-Resolution Analysis (MRA) is employed as a signal processing tool for recognition of characteristic features in the voltage signal needed for locating the fault. By implementing a notional high-fidelity DC Zonal Electric Distribution System and Simulation (DCZEDS) model in the transient simulation environment PSCAD/EMTDC effects such as frequency dependent characteristic of cables and the interactions with power electronic circuits comprising the many converter systems can be represented. To study the key technical issues surrounding the new fault locating method a notional high-fidelity DCZEDS model in PSCAD/EMTDC is implemented as depicted in FIG. 1.

DCZEDS (10) includes multiple zones. Two of these zones (zone 2 (16) and zone 3 (20)) are shown. Two buses run to the zones. These are bus 1 (12) and bus 2 (14), each of which contains a (+) line and a (−) line. The system is either not grounded or grounded through a high-resistance connection.

Each zone has a number of electrical loads which are grouped together in FIG. 1. Zone 2 has a pair of DC/DC converters (26) feeding the loads. In zone 2, the converters feed zone 2 load (18). In zone (3), the converters feed zone 3 load (22).

Cable effects are preferably modeled in the creation of a simulation used to study noise phenomena in the system. To accurately represent the system behavior at different frequencies, the frequency dependent (phase) cable model in EMTDC is used which represents the complete frequency dependence of all cable parameters. In addition, the separately controlled power electronic circuits comprising the many converter systems are included to introduce the interactions with parasitic elements (i.e. cable insulation capacitances and series inductances). The approach using MRA wavelet is tested in the DCZEDS model. The simulation results show that locating faults on both the "switched" rails (linking the (+) side of the two buses) and the common rails (linking the (−) side of the two buses) can be achieved due to the different characteristic information contained in the monitored signal.

Wavelet transforms use the scaling property, which means a short data window to extract the high frequencies and a long data window to extract the low frequencies. On account of this, considerable attention has been given to the application of wavelet decomposition in order to detect high frequency waveforms which appear in power systems as result of disturbances like short-circuit, lightning, and other events that normally jeopardize the health of the system. After such disturbances are detected, these high frequency signals can be used for protection and supervision reasons, which include fault identification and fault location.

Wavelet transform is a linear operation that decomposes a signal into different scales with different levels of resolution. Differently from Fourier analysis, that provides a global representation of a signal, WT provides a local representation (in time and in frequency) of a signal. This "location" (position) in time allows the detection of disturbances, as soon as they appear. Besides, it is possible to analyze different band of frequency The wavelet transform of a continuous signal (WTC) $f(t)$, defined in a vector space of integrable quadratic functions $L^2(R)$, is given by:

$$WTC(a, b) = \langle f(t), \psi_{ab}(t) \rangle = \int_{-\infty}^{\infty} f(t)\psi_{ab}^*(t)dt, \quad (1)$$

The symbol "*" denotes the complex conjugate and the functions $\psi_{ab}(t)$ are scaling and translation versions of a given function $\psi(t)$, denominated "mother" wavelet, and given by:

$$\psi_{ab}(t) = \frac{1}{\sqrt{a}}\psi\left(\frac{t-b}{a}\right), \tag{2}$$

In equation (2) $a \in R^+$ and $b \in R$, and they are denominated of scaling (expansion or contraction) and translating parameters, respectively. Both of them vary continuously.

Just as a discrete Fourier transform can be derived from a Fourier transform, so can a discrete wavelet transform be derived from a continuous wavelet transform for computer use.

The parameters a and b are then discretized and a very common way for that is doing $a = a_0^m$, $b = \overline{n} \cdot a_0^m b_0$ with $m, n \in Z$, $a_0 > 1$ and $b_0 \neq 0$. With this procedure, the result of (1) will be a finite assembly of coefficients, but still a continuous representation of WT. Such a transformation is normally denominated wavelet series expansion.

If the signal is also a temporal series $f(k)$, then, the Discrete Wavelet Transform (DWT) must be used, which is defined by:

$$DWT_f^{\psi}(j, k) = \frac{1}{\sqrt{a_0^j}} \sum_{n=-\infty}^{\infty} f(n) \psi\left[\frac{n - a_0^j k b_0}{a_0^j}\right] \tag{3}$$

With a careful selection of $a_0$ and $b_0$, families of expanded wavelets can constitute an orthonormal basis of a space $L^2(R)$. The simplest choice for this is selecting $a_0=2$ and $b_0=1$. In this case, the wavelet transform is denominated dyadic orthonormal. The main reason for such a procedure is that the technique can be easily and quickly implemented like a filter bank, normally known as Multi-Resolution Analysis (MRA) (Mallat, S. G., 1989a).

The basic idea of the MRA is to divide the frequency spectrum of a signal in different sub-bands. In doing so, each sub-band can be handled considering the desired purpose. MRA is started by choosing a suitable function $\phi(x)$ denominated scaling function, whose descriptive characteristics are: finite energy, oscillatory, zero average and a fast decay in both sides. This function can be obtained as a recursive way, from the function itself, compressed and translated, as:

$$\phi(x) = \sum_n g(n)\sqrt{2}\, \phi(2x - n), n \in Z, \tag{4}$$

where the samples $g(k)$ are defined as the internal product of $\phi(x) \in \sqrt{2}\phi(2x-k)$ representing the coefficients of scaling filter. Otherwise, the "mother" wavelet function $\psi(x)$, can also be obtained by a similar way:

$$\psi(x) = \sum_n (-1)^n g(-n+1)\sqrt{2}\, \phi(2x - n), n \in Z, \tag{5}$$

If the "daughter" wavelets, given by:

$$\psi_{j,k} = 2^{j/2} \psi(2^{-j} x - k), j, k \in Z, \tag{6}$$

form an orthogonal basis to $L^2(R)$, additional advantages are obtained (Mallat, S. G., 1989b). With $\phi_k(x)$ and $\phi_{j,k}(X)$ generating a space $L^2(R)$, any function $f \in L^2(R)$ can be written as a series expansion of n terms of the wavelet and scaling functions, as follows:

$$f(x) = \sum_{k=-\infty}^{\infty} c_N(k)\phi_{N,k}(x) + \sum_{j=1}^{N}\sum_{k=-\infty}^{\infty} d_j(k)\psi_{j,k}(x), \tag{7}$$

being the parameters $d_1(k), d_2(k), \ldots d_N(k)$ the wavelet coefficients (WTCs) and the sequence $\{c_N(k)\}$ the lowest resolution signal (approximation scale) in level N.

In terms of signal processing, the structures of (4) and (5) suggest that the wavelet analysis does not need to deal directly with the functions $\phi(x)$ and $\psi(x)$, but only with the coefficients $g(n)$ and $h(n)$—equation (8), as well as the expansion coefficients $d_j(k)$ and $c_j(k)$, present in (7).

$$h(n) = (-1)^n g(-n+1), \tag{8}$$

Thus, WT, when used to analyze a discrete signal, can be implemented by the use of two digital filters: a high-pass, $h(n)$, related to a given mother wavelet $\psi(x)$, and its low-pass mirror version, $g(n)$, associated to the scaling function $\phi(x)$.

Figure 4:
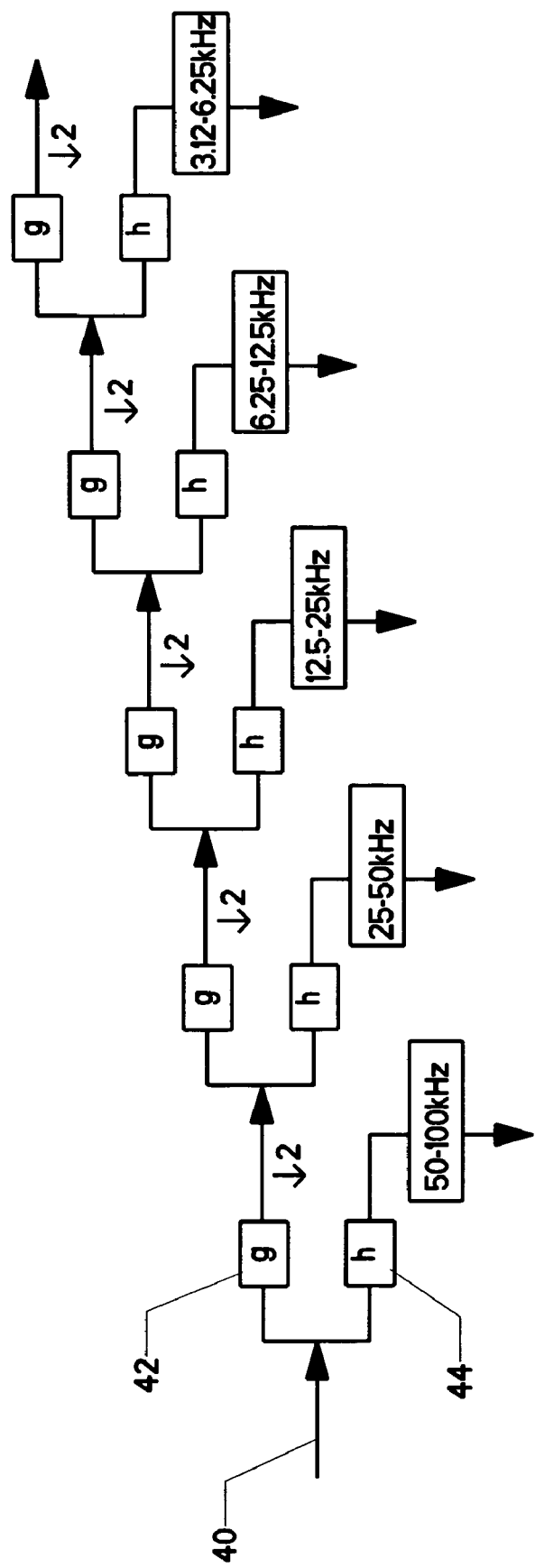
FIG. 4 is a schematic view, showing the splitting a an input signal in the performance of a Multi-Resolution Analysis.

Having these filters, one can build a filtering structure to decompose a signal in different resolution levels, such as the one shown in FIG. 4 (Silveira, P. M. at al. 2007). In this structure, the number of decomposition levels depends on the desired application. Input signal (40) is fed into the structure from a convenient source within the power system. It is initially split by the application of low pass filter (42) and high pass filter (44). The split signal is then split again, for as many iterations as are needed to achieve the objective. The embodiment shown in FIG. 4 shows five sets of low and high pass filters.

The operator "↓2" represents a down-sampling by a factor of two, which produces the scaling of the signal for the next stage of processing. In this way, the decomposed signal has half of the samples of the previous signal (half of the bandwidth). Representative frequencies emerging from each stage are shown as well. The sampling rate (frequencies) and the number of levels showed in this figure are only representatives and can be modified according to the application with the faster time-varying events requiring higher sampling rates.

Another important consideration when using wavelet approach is the choice of a mother wavelet. There are several types of wavelet, such as Daubechies, Symlets, Coiflets, Meyer, Biorthogonals, etc., that can be selected. However, the "optimal" choice of the wavelet basis will depend on the application.

Figure 5:
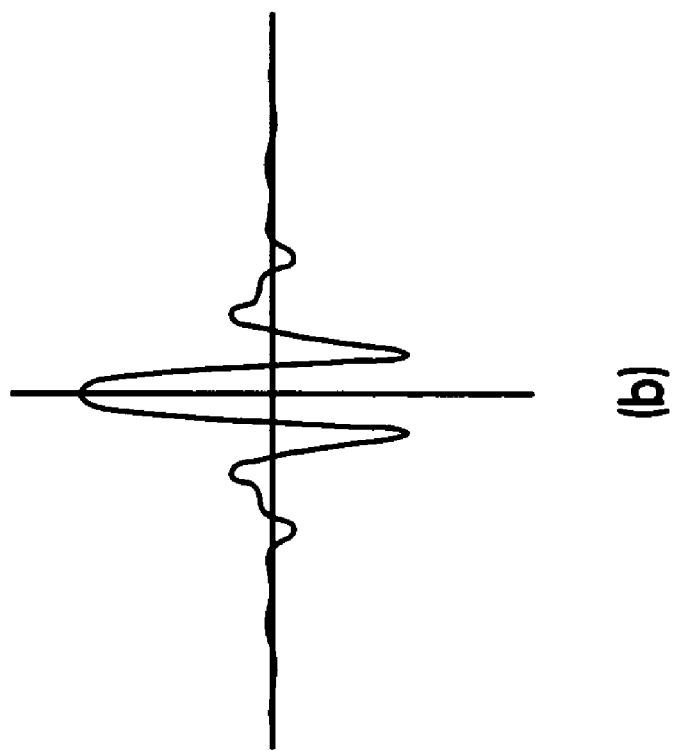
FIG. 5 is a plot view, showing two types of waveforms.
Figure 5:
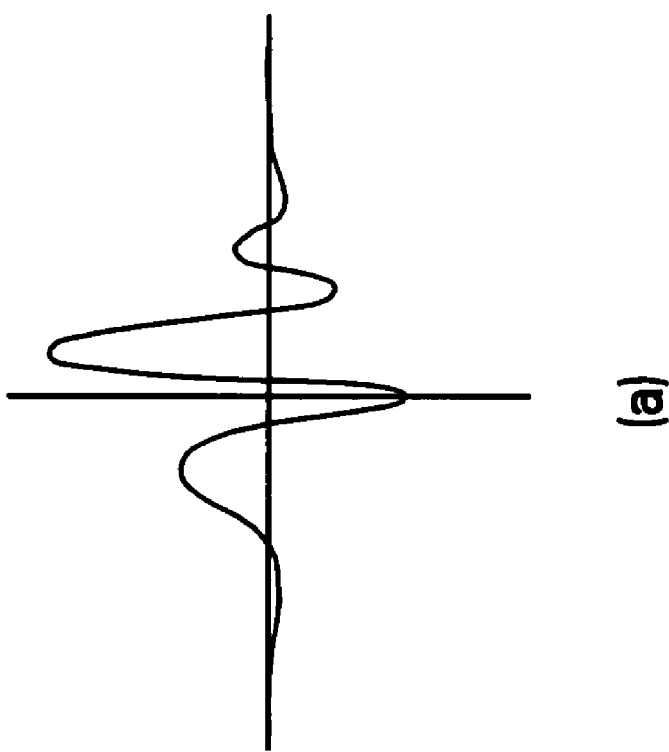

For example, the celebrated Daubechies wavelets (FIG. 5(a)) are orthogonal and have compact support, but they do not have a closed analytic form and the lowest-order families do not have continuous derivatives everywhere. On the other hand, wavelets like modulated Gaussian function or harmonic waveforms (FIG. 5(b)) are particularly useful for harmonic analysis due to their smoothness.

Local Measurement and Fault Characteristics

Figure 3:
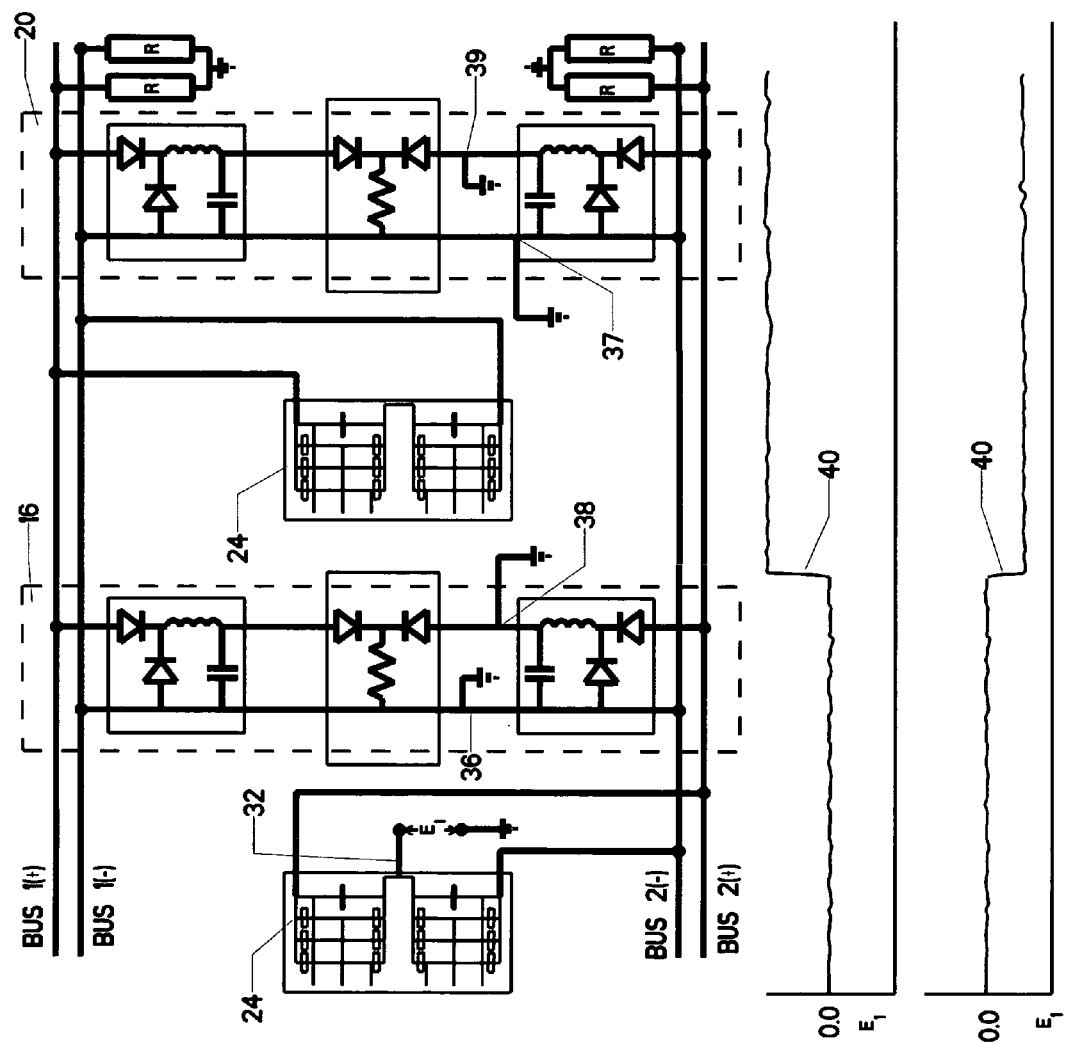
FIG. 3 is a schematic view, showing the detection of a phase to ground fault.

The system under consideration has been modeled taking into account different phase-to-ground fault situations. FIG. 3 shows a representative system with four possible ground fault locations being considered. The rectifier 24 shown on the left side of the view feeds the (+) and (−) rails of bus 2 (14). A voltage to ground measurement is taken at the center tap of this rectifier (denoted as center tap (32)). The voltage at this point would theoretically be zero. However, as discussed previously, the noise introduced by the switching of the power electronics will cause the actual voltage to vary (though the "noise" should remain relatively small).

FIG. 3 shows two zones (zone 2 (16) and zone 3 (20)). Four possible fault locations are shown. These are: zone 2 (−) fault (36); zone 2 (+) fault 38; zone 3 (−) fault 37; and zone 3 (+) fault (39). The plots at the bottom of the view show voltage readings taken between center tap (32) and ground (This voltage being known as "E1"). The upper plot shows the effect of the introduction of zone 2 (−) fault (36). The reader will observe the presence of voltage offset (40) at the time the fault occurs. The lower plot shows the effect of the introduction of zone 2 (+) fault (38). A voltage shift occurs in this case as well, though obviously the offset is in the opposite direction.

As discussed earlier, a phase-to-ground fault in ungrounded or high-resistance grounded DC systems does not cause large currents to flow. However, the voltage of the faulted phase collapses to zero, while the sounded phase changes in order to maintain the phase-to-phase voltage. The voltage at center tap (32) responds rapidly to these conditions. During steady state and non-fault conditions this voltage is zero and only contains small oscillations stemming from the PE switching events. Immediately after the fault the voltage will change by following the bus voltages. It is important to remark that for faults on the positive phase within a zone, i.e. between DC/DC converters, the voltage variation is smaller due to the approximately 200 V drop across the DC/DC converter. This fact explains why the voltage offset in the upper plot of FIG. 3 is larger than the voltage offset in the lower plot.

The significant change in E1 can easily be used to identify a fault occurrence on either the positive or the negative rail and, in the present case, distinguish between a fault within a zone or on the lateral buses. Nevertheless, in order to more precisely find the fault location a more elaborate solution is required. Here the MRA may be used to process the voltage signal in more detail and extract features which allow the more precise location of the fault location.

Figure 6:
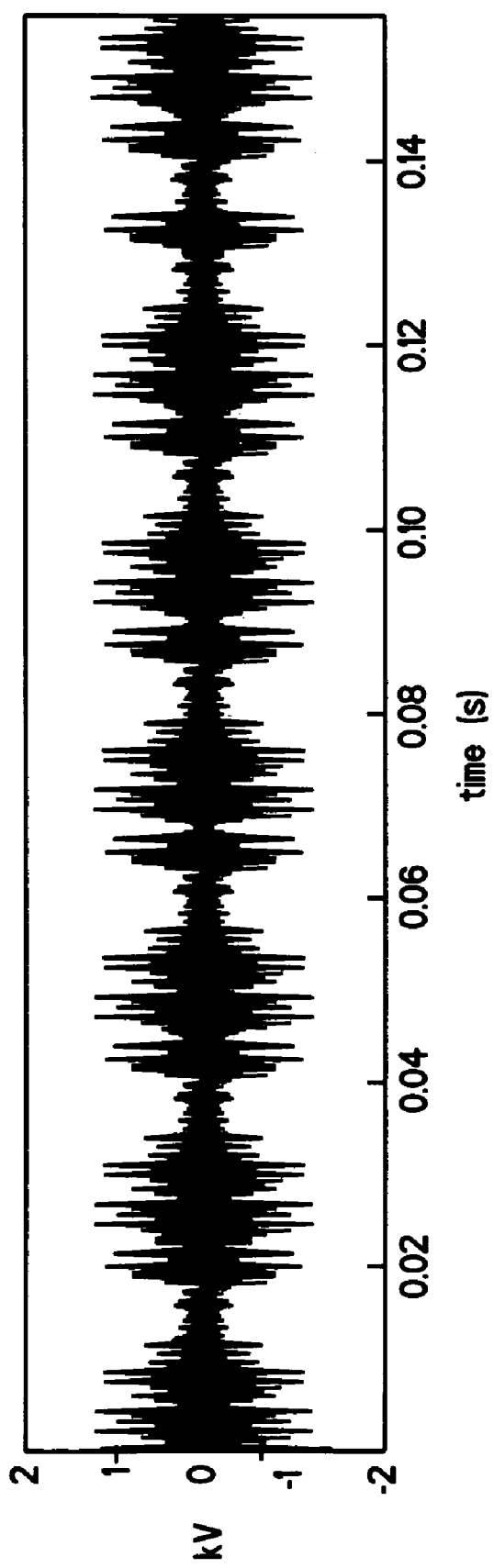
FIG. 6 is a plot view, showing a non-faulted noise signal.

In order to explain the new method we first consider the mid-point voltage signal of the nonfaulted system, measured (i.e. here simulated) with a high resolution. As illustrated by FIG. 6 some significant switching noise is contained in this signal. This noise is caused by the repetitive switching transients introduced by the PE converters interacting with parasitic elements (i.e. cable insulation capacitances and cable inductances) in the system. In a real system this noise may be typically less pronounced due to the higher damping from additional losses not yet modeled adequately in the simulated system.

The Method for Fault Location

Figure 7:
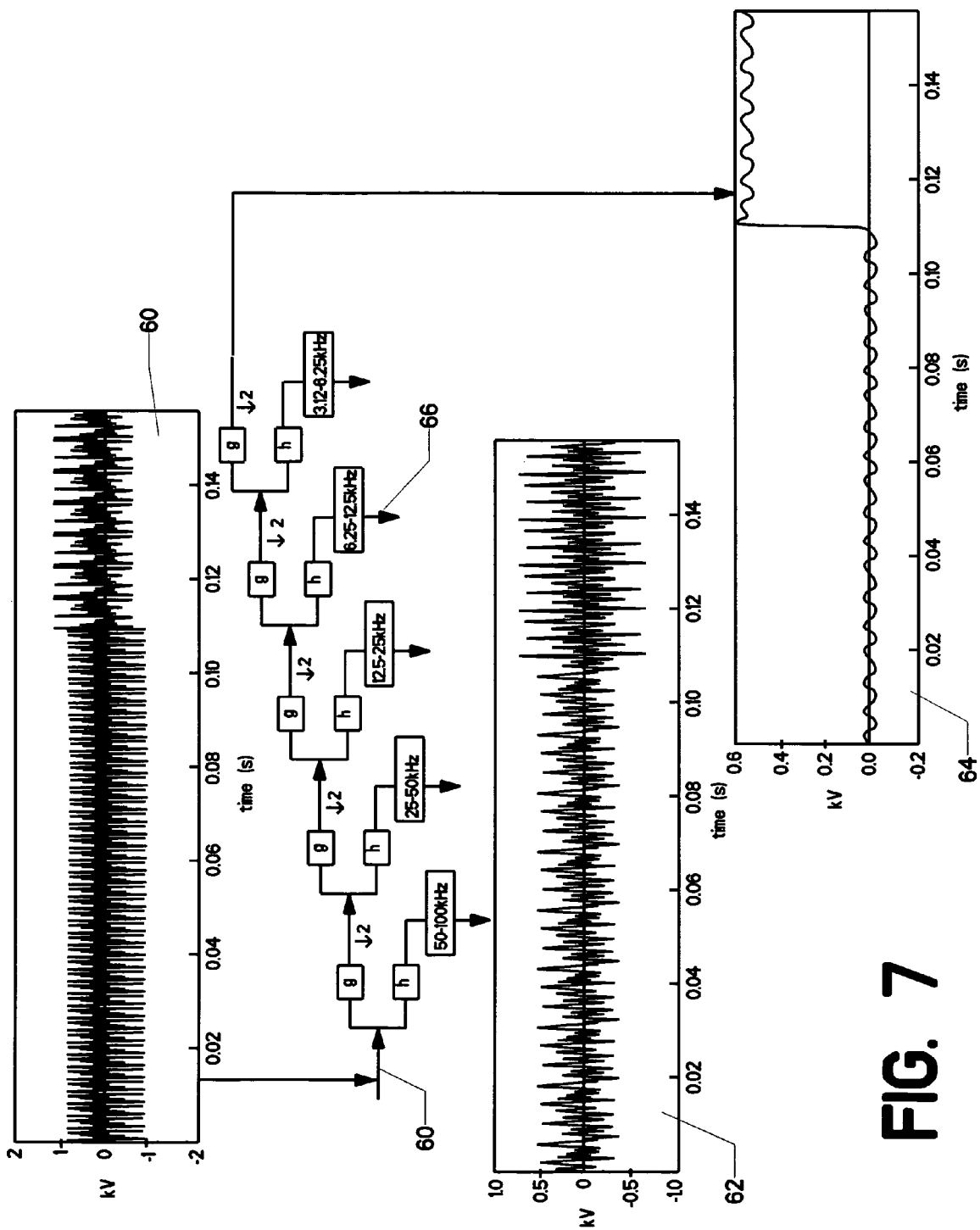
FIG. 7 is a combined schematic and plot view, showing the MRA of FIG. 4 and two output signals.

The main idea is to recognize that, after a fault occurrs, the noise pattern of the mid-point voltage (E1) is different for different fault locations. Hence, the noise in E1 contains certain information which allows for distinguishing different fault locations. In the present case, MRA is applied to accomplish this task. As each output of the filter bank contains a different frequency bandwidth, one or more of them may reveal specifics characteristics or distinct patterns which allows for the fault localization. A structure of MRA with six to ten decompositions and reconstructions levels has been used having E1 as the input signal as shown in FIG. 7. Center tap signal (60) is sent through sets of high and low pass filters. The upper plot shows the input signal. First frequency output (62) is shown in the middle plot. Sixth frequency output (64) is shown in the bottom plot. A ground fault occurs at t=0.1095 s.

Figure 8:
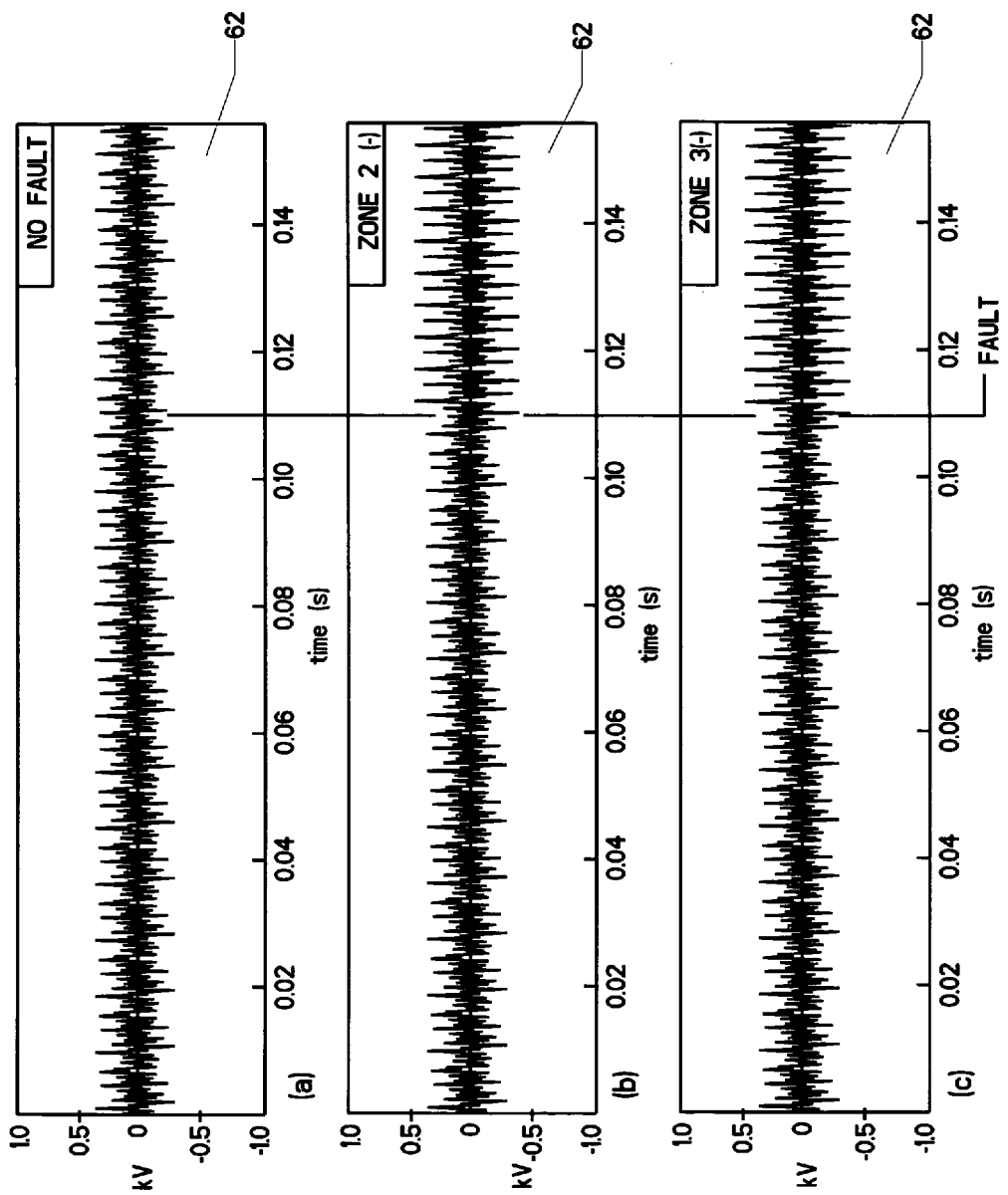
FIG. 8 is a plot view, showing comparative signals in output 1 of the MRA of FIG. 4.

The signals in each output can be compared for different operations conditions and fault positions. FIG. 8 shows first frequency output (62) of the MRA for three different conditions: (a) no fault; (b) fault in zone two (−), and (c) fault in zone three (−). The exact time of the fault is indicated (0.1095 s).

Figure 9:
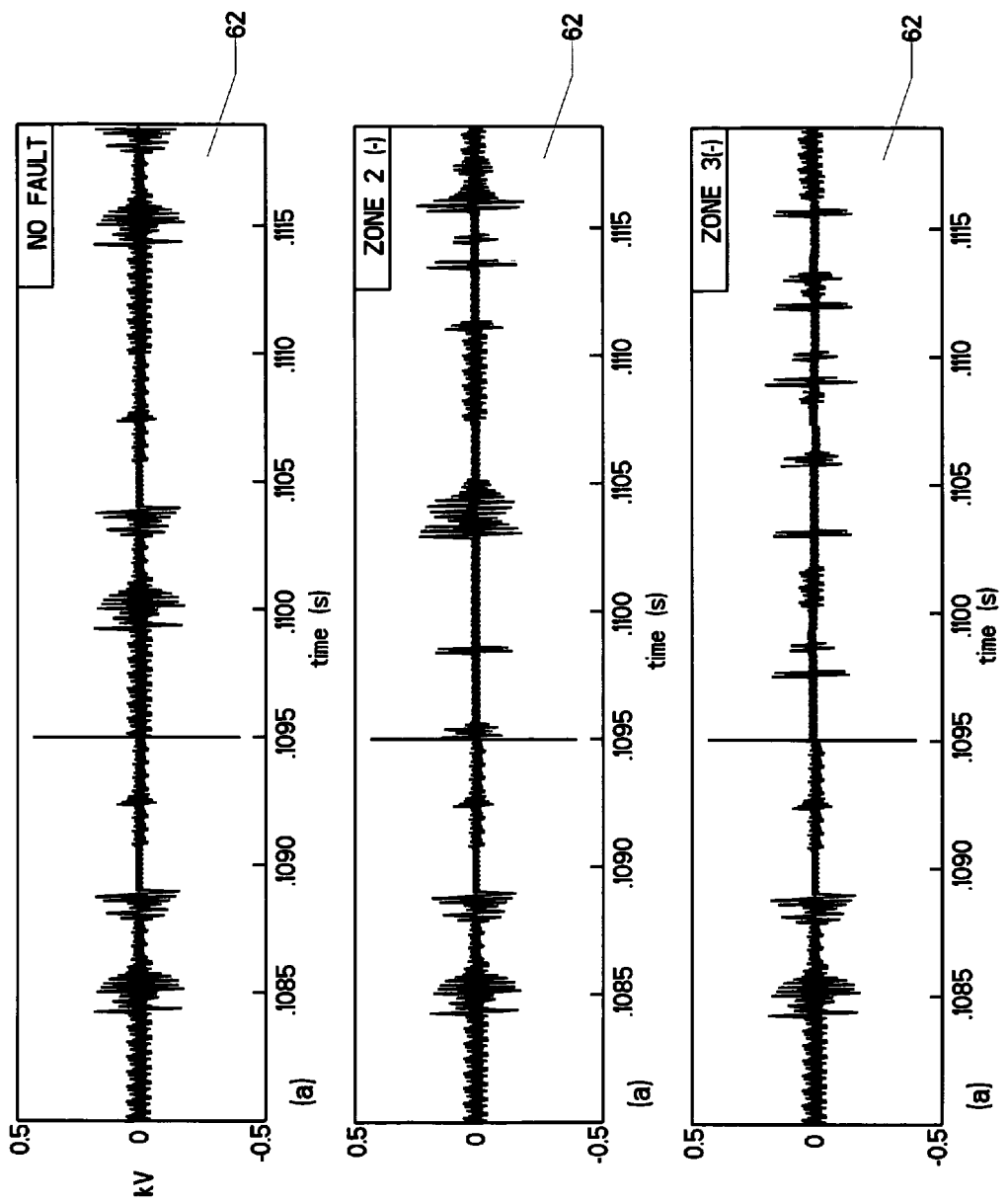
FIG. 9 is a plot view, showing an enlargement of the signals of FIG. 8.

Comparing the results in FIG. 8, it appears that there is only an amplification of the switching noise for each fault condition. No unique essential feature revealed. However, an enlarged view of FIG. 8 around 0.11 s, reproduced in FIG. 9, shows the existence of distinct patterns contained in the voltage signal after the fault occurs. Some different oscillations, with different amplitude and duration, can be seen in the signal measured for a fault in zone 3 (−), as compared with the signal when the fault occurs in zone 2 (−). This change of pattern indicates that the new method can, in principle, reveal the location of the phase-to-ground fault within the DCZEDS.

Cable Modeling

One important question that has been carefully examined concerns the modeling of the cables. Considering, that cables in such a systems are short they are typically modeled by lumped parameter models. This is the case for the results presented in FIG. 8 and FIG. 9. However, this kind of modeling may not represent correctly what happens in a real system. Therefore, a more accurate cable model with distributed parameters has also been used and the same approach previously described for extracting the distinct noise features for locating the fault has been applied. As a consequence of the distributed parameter cable model new resonance frequencies appear in the voltage E1 during disturbances. Therefore, when applying the MRA the desired pattern to recognize the fault location may be present in another resolution level as illustrated in FIG. 10.

Figure 10:
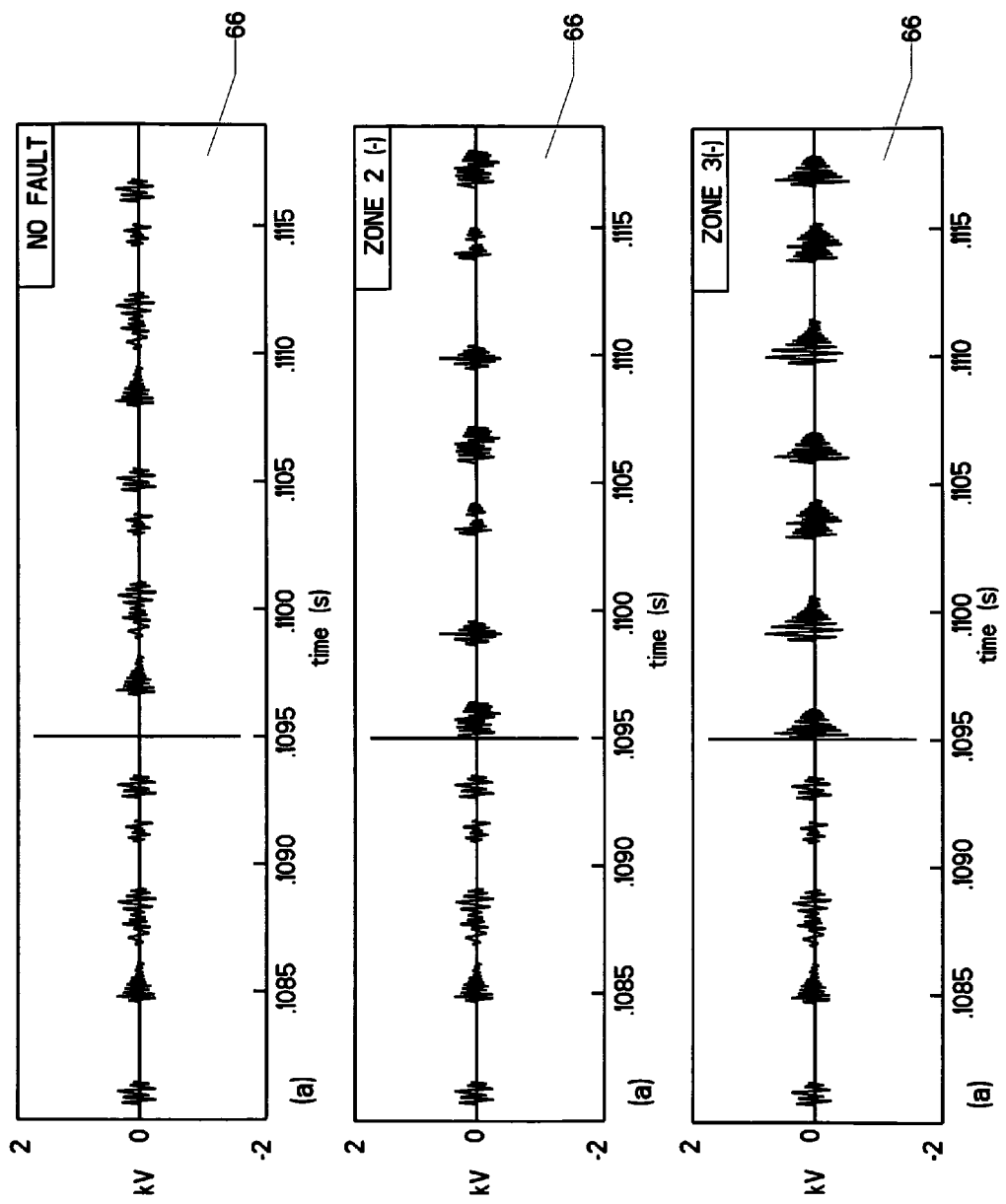
FIG. 10 is a plot view, showing comparative signals of the MRA of FIG. 4.

Using the same sampling rate and performing the MRA with input E1, the best result to be used for fault location has been found in output four (detailed level 4, labeled as fourth frequency output (66) in FIGS. 7 and 10). Nevertheless, a proper fault location algorithm, can easily locate the fault in zone three (−), considering the existence of oscillations with higher amplitude and duration for such a fault when compared with the signal for a fault in zone two (−). Similar results have been found for faults in zone two (+) and zone 3 (+).

Choice of Mother Wavelet and Number of Decompisition Levels

Figure 11:
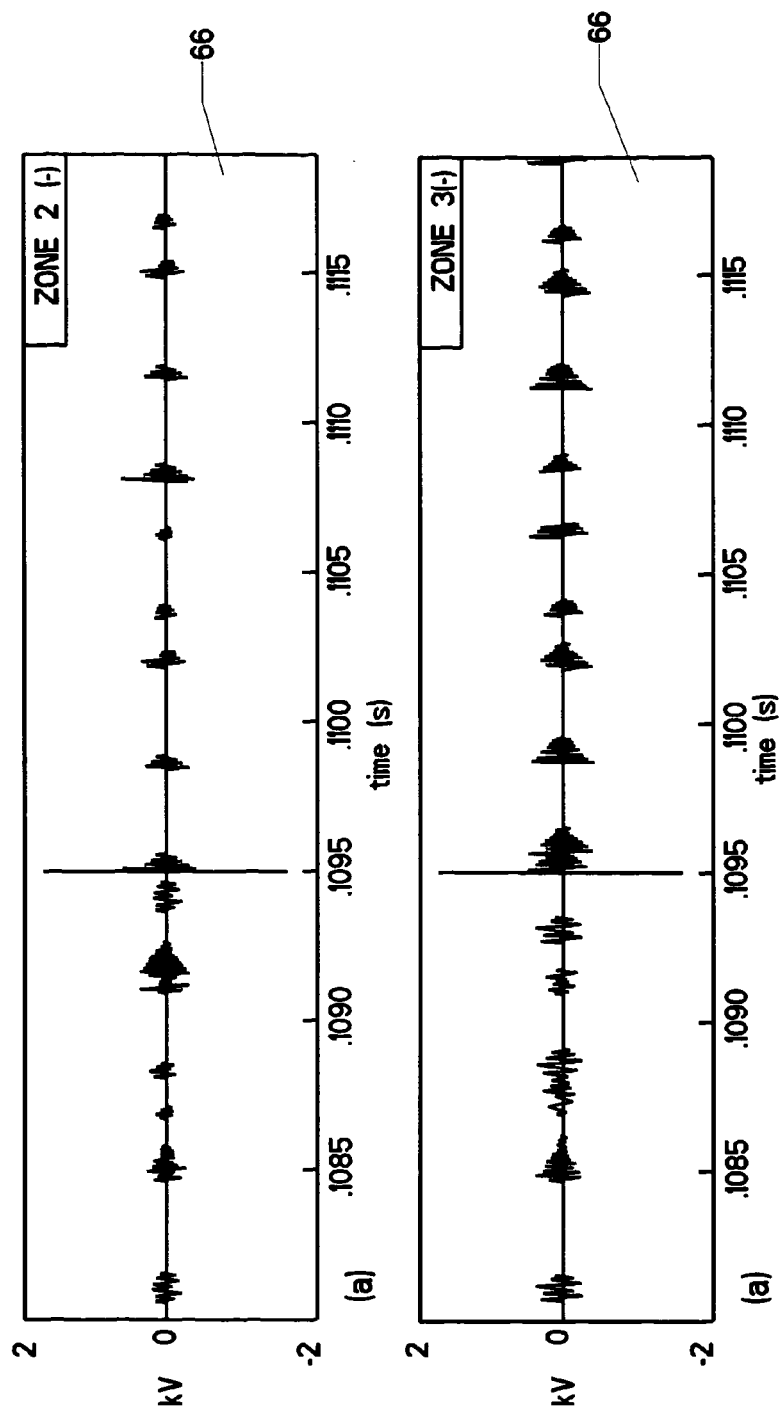
FIG. 11 is a plot view, showing comparative signals of the MRA of FIG. 4.

The mother wavelet and the number of decomposition levels are two important characteristics of a filter bank. The performance of signal extraction highly depends on the mother wavelet used. For the application demonstrated in this disclosure the Meyer wavelet has been used. However, the authors have found that other mother wavelets, including those with shorter data window like Daubechies will not affect the overall performance of the proposed approach significantly. FIG. 11 shows the results when using the Daubechie wavelet with only four coefficients ("db2" according to the Wavelet Toolbox in MATLAB). This is an important issue for a practical implementation, considering that the length of the wavelet window impacts the time for processing the signal and hence the time to locate the fault.

The number of decomposition levels depend on the signal sampling rate and is governed by the need to extract the necessary information for reliable fault location. In the above example level four has demonstrated the best results for fault location. Thus, a MRA with at least four levels it is necessary in this case.

In summary, electrical direct current (DC) distribution systems are operated without any of the phases grounded in order to prevent a phase-to-ground fault. While theoretically such an ungrounded DC system can be operated with one phase grounded through a fault for extended period of time it is essential to find the fault location quickly in order to prevent any secondary phase to ground fault on the other phase to cause a disruptive phase-to-phase fault. The idea is to utilize the switching noise contained in a suitable signal, for example a voltage signal measured between the mid point of a voltage divider circuit (preferably a capacitive circuit) and ground to extract information about the fault location. In any real DC distribution system which contains power electronic (PE) switching converters for voltage and power flow control such a signal will always contain a certain amount of high frequency noise. This is caused by repetitive switching transients introduced by the PE converters interacting with parasitic elements (i.e. cable insulation capacitances) in the system. In case of a phase-to-ground fault this voltage signal contains characteristic information in the high frequency range above the switching frequencies of the PE converters to which allows for localization of the fault. In a particular implementation, Wavelet analysis may be used as a signal processing tool for recognition of characteristic features in the voltage signal needed for locating the fault.

The correlation of the noise signals against the various ground fault locations can be done using a variety of techniques. As one example, actual ground faults could be created in a finished system (preferably using relatively high-resistance faults to minimize unwanted effects) and the variations in the noise signal could be measured, recorded, and analyzed. Detection algorithms could then be created to look for the specific wave forms indicating the fault at a given location.

Of course, with modern simulation techniques, it may not be necessary to perform actual ground fault testing. With a detailed computer simulation, the noise effects associated with each potential ground fault location can be accurately simulated. Thus, when this disclosure suggests creating a ground fault at a given location and monitoring the result, the reader should understand this process to encompass the use of computer simulation and other predictive techniques, though the physical act of actually creating a ground fault could be used as well.

The preceding description contains significant detail regarding the novel aspects of the present invention. It should not be construed, however, as limiting the scope of the invention but rather as providing illustrations of the preferred embodiments of the invention. Thus, the scope of the present invention should be fixed by the following claims rather than by any of the specific examples provided.

Having described our invention, we claim:

1. A method for locating ground faults in an ungrounded or high-resistance grounded power distribution system having a power supply including high-speed switched power electronics, comprising:
   a. measuring a voltage with respect to ground associated with said power supply over time in order to establish a nominal noise pattern in said voltage which is consistent with a non-faulted condition;
   b. creating a ground fault at a first location within said power distribution system and noting a first altered pattern in said voltage;
   c. monitoring said voltage in order to detect a deviation in said nominal noise pattern, thereby determining the existence of a ground fault; and
   d. monitoring said voltage in order to detect the presence of said first altered pattern, thereby determining that said ground fault has occurred at said first location.

2. A method for locating ground faults as recited in claim 1, further comprising:
   a. creating a ground fault at a second location within said power distribution system and noting a second altered pattern in said voltage; and
   b. monitoring said voltage in order to detect the presence of said second altered pattern, thereby determining that said ground fault has occurred at said second location.

3. A method for locating ground faults as recited in claim 1, wherein said step of monitoring said voltage in order to detect the presence of said first altered pattern is carried out using multi-resolution analysis.

4. A method for locating ground faults as recited in claim 1, wherein said step of monitoring said voltage in order to detect the presence of said first altered pattern comprises:
   a. providing an input signal, which is said voltage measured over time;
   b. splitting said input signal into a first signal and a second signal;
   c. feeding said first signal through a first low pass filter and then down sampling the result to create a third signal;
   d. feeding said second signal through a first high pass filter to create a fourth signal; and
   e. analyzing at least one of said input, third, and fourth signals to detect said first altered pattern.

5. A method for locating ground faults as recited in claim 4, further comprising:
   a. feeding said third signal through a second low pass filter and then down sampling the result to create a fifth signal;
   b. feeding said third signal through a second high pass filter to create a sixth signal; and
   c. analyzing at least one of said input, third, and fourth, fifth, and sixth signals to detect said first altered pattern.

6. A method for locating ground faults as recited in claim 5, further comprising:
   a. feeding said fifth signal through a third low pass filter and then down sampling the result to create a seventh signal;
   b. feeding said fifth signal through a third high pass filter to create an eighth signal; and
   c. analyzing at least one of said input, third, fourth, fifth, sixth, seventh, and eighth signals to detect said first altered pattern.

7. A method for locating ground faults as recited in claim 6, wherein said down sampling is a factor of two.

8. A method for locating ground faults as recited in claim 5, wherein said down sampling is a factor of two.

9. A method for locating ground faults as recited in claim 4, wherein said down sampling is a factor of two.

10. A method for locating ground faults in an ungrounded or high-resistance grounded power distribution system having a power supply including high-speed switched power electronics, comprising:
   a. measuring a voltage with respect to ground associated with said power supply over time in order to establish a nominal noise pattern in said voltage which is consistent with a non-faulted condition;
   b. creating a ground fault at a plurality of locations within said power distribution system and noting a corresponding altered pattern in said voltage for each of said plurality of locations; and
   c. monitoring said voltage in order to detect the presence of one of said altered patterns, thereby determining that a ground fault has occurred at one of said plurality of locations which corresponds to said altered pattern.

11. A method for locating ground faults as recited in claim 10, wherein said step of monitoring said voltage in order to detect the presence of one of said altered patterns is carried out using multi-resolution analysis.

12. A method for locating ground faults as recited in claim 11, wherein said step of monitoring said voltage in order to detect the presence of said first altered pattern comprises:
   a. providing an input signal, which is said voltage measured over time;
   b. splitting said input signal into a first signal and a second signal;
   c. feeding said first signal through a first low pass filter and then down sampling the result to create a third signal;
   d. feeding said second signal through a first high pass filter to create a fourth signal; and
   e. analyzing at least one of said input, third, and fourth signals to detect said first altered pattern.

13. A method for locating ground faults as recited in claim 12, further comprising:
   a. feeding said third signal through a second low pass filter and then down sampling the result to create a fifth signal;
   b. feeding said third signal through a second high pass filter to create a sixth signal; and
   c. analyzing at least one of said input, third, and fourth, fifth, and sixth signals to detect said first altered pattern.

14. A method for locating ground faults as recited in claim 13, further comprising:
   a. feeding said fifth signal through a third low pass filter and then down sampling the result to create a seventh signal;
   b. feeding said fifth signal through a third high pass filter to create an eighth signal; and
   c. analyzing at least one of said input, third, fourth, fifth, sixth, seventh, and eighth signals to detect said first altered pattern.

15. A method for locating ground faults as recited in claim 14, wherein said down sampling is a factor of two.

16. A method for locating ground faults as recited in claim 13, wherein said down sampling is a factor of two.

17. A method for locating ground faults as recited in claim 12, wherein said down sampling is a factor of two.

* * * * *